US 7,419,382 B2

(12) United States Patent
Suzuki et al.

(10) Patent No.: US 7,419,382 B2
(45) Date of Patent: Sep. 2, 2008

(54) PRINTED CIRCUIT BOARD, ELECTRONIC DEVICE, AND MANUFACTURING METHOD FOR PRINTED CIRCUIT BOARD

(75) Inventors: Daigo Suzuki, Yokohama (JP); Akihiko Happoya, Fussa (JP); Hidenori Tanaka, Hachioji (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 11/589,332

(22) Filed: Oct. 30, 2006

(65) Prior Publication Data

US 2007/0099449 A1     May 3, 2007

(30) Foreign Application Priority Data

Oct. 31, 2005  (JP)  ............... 2005-317534

(51) Int. Cl.
*H01R 12/00* (2006.01)
(52) U.S. Cl. ..................................... 439/70
(58) Field of Classification Search .................. 439/74, 439/66–67, 70, 71; 29/846, 852, 830, 874, 29/832
See application file for complete search history.

(56) References Cited

U.S. PATENT DOCUMENTS 4,792,672 A * 12/1988 Schmitz .................. 250/214.1
5,328,534 A * 7/1994 Calhoun et al. ............ 156/150
5,415,555 A * 5/1995 Sobhani ...................... 439/74
6,395,993 B1 * 5/2002 Nakamura et al. .......... 174/254
6,518,518 B1 * 2/2003 Saiki et al. .................. 174/267
6,566,149 B1 * 5/2003 Kanamaru et al. ............ 438/14
2004/0003358 A1 * 1/2004 Araki et al. ..................... 716/5

FOREIGN PATENT DOCUMENTS

| JP | 2001-358445 | 12/2001 |
| JP | 2003-303849 | 10/2003 |
| JP | 2005-109307 | 4/2005 |

* cited by examiner

*Primary Examiner*—Jean F Duverne
(74) *Attorney, Agent, or Firm*—Knobbe, Martens, Olson & Bear, LLP

(57) ABSTRACT

According to one embodiment, a printed circuit board includes a first dielectric layer, a circuit component mounted on the first dielectric layer, and a second dielectric layer. The first dielectric layer is provided with a via hole which opens at a surface thereof and in which a conductive layer is provided, and a conductive pattern connected electrically to the conductive layer of the via hole. The circuit component is provided with a bump at least a part of which is inserted in the via hole and bonded to an inner surface of the via hole. The second dielectric layer is formed provided with another conductive pattern and laminated to the first dielectric layer to cover the circuit component.

7 Claims, 10 Drawing Sheets

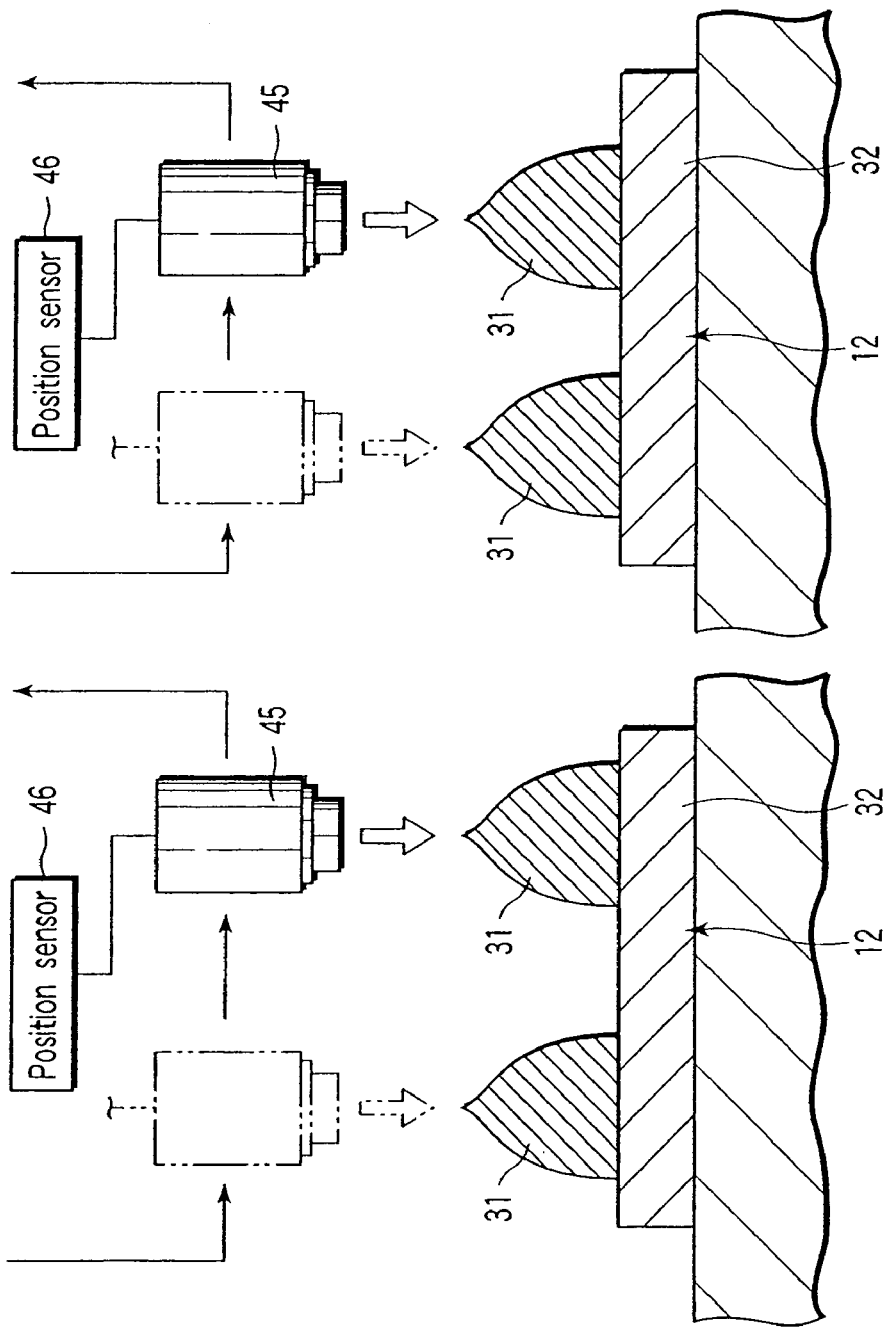
F I G. 6

PRINTED CIRCUIT BOARD, ELECTRONIC DEVICE, AND MANUFACTURING METHOD FOR PRINTED CIRCUIT BOARD

CROSS-REFERENCE TO RELATED APPLICATIONS

This application is based upon and claims the benefit of priority from Japanese Patent Application No. 2005-317534, filed Oct. 31, 2005, the entire contents of which are incorporated herein by reference.

BACKGROUND

1. Field

One embodiment of the invention relates to a printed circuit board, an electronic device provided with the printed circuit board, and a manufacturing method for the printed circuit board, for example, a structure and a method for mounting a circuit component.

2. Description of the Related Art

An electronic device such as a portable computer includes a printed circuit board. The printed circuit board includes a printed wiring board and a circuit component mounted on the wiring board. A conductive pattern is formed on the wiring board. An IC chip or capacitor is an example of the circuit component.

In recent years, a surface mount system has been widely used as a method of mounting the circuit component on the printed wiring board. According to the surface mount system, bumps on the lower surface of the circuit component are bonded to pads on the surface of the printed wiring board. In general, each pad is formed of a smooth copper foil or the like. Therefore, each bonded surface of each pad and each bump is a flat surface that extends along the shape of the pad.

A printed wiring board having a recess in a conductive layer is described in, for example, Jpn. Pat. Appln. KOKAI Publication No. 2003-303849. This printed wiring board includes a conductive layer formed having a recess and a spherical connecting member mounted therein. When a semiconductor element is mounted on the printed board, the connecting member is plastically deformed and partially gets into the recess. This connecting member connects the semiconductor element electrically to the printed wiring board.

If the bonded surfaces of the pad and the bump are flat surfaces, the bond area between them cannot be very large. Therefore, the bond strength, especially the shear strength, between the pad and the bump cannot be very high. If the bond strength between the pad and the bump is not high enough, the bonded surfaces of the pad and the bump may possibly be separated when the circuit component is subjected to a great force.

BRIEF DESCRIPTION OF THE SEVERAL VIEWS OF THE DRAWING

A general architecture that implements the various feature of the invention will now be described with reference to the drawings. The drawings and the associated descriptions are provided to illustrate embodiments of the invention and not to limit the scope of the invention.

FIG. 6 is an exemplary sectional view showing a position detection process for bumps according to the first embodiment;

DETAILED DESCRIPTION

Various embodiments according to the invention will be described hereinafter with reference to the accompanying drawings.

In general, according to one embodiment of the invention, a printed circuit board includes a first dielectric layer provided with a via hole which opens at a surface thereof and in which a conductive layer is provided, and a conductive pattern connected electrically to the conductive layer of the via hole; a circuit component mounted on the first dielectric layer and provided with a bump at least a part of which is inserted in the via hole and bonded to an inner surface of the via hole; and a second dielectric layer provided with another conductive pattern and laminated to the first dielectric layer to cover the circuit component.

In general, according to one embodiment of the invention, an electronic device includes a case; and a printed circuit board which is contained in the case and includes a first dielectric layer provided with a via hole which opens at a surface thereof and in which a conductive layer is provided and a conductive pattern connected electrically to the conductive layer of the via hole, a circuit component mounted on the first dielectric layer and provided with a bump at least a part of which is inserted in the via hole and bonded to an inner surface of the via hole, and a second dielectric layer provided with another conductive pattern and laminated to the first dielectric layer to cover the circuit component.

In general, according to one embodiment of the invention, a manufacturing method for a printed circuit board includes preparing a dielectric layer provided with a via hole which opens at a surface thereof and in which a conductive layer is provided and a conductive pattern connected electrically to the conductive layer of the via hole, and a plurality of circuit components formed each including a bump; detecting an opening position of the via hole of the dielectric layer; detecting positions of the bumps formed on the circuit components, individually; selecting the circuit component including the bump situated in a position which is suitable for the opening position of the via hole; and mounting the selected circuit component on the dielectric layer so that the bump is aligned with the via hole and bonding at least a part of the bump to an inner surface of the via hole.

Embodiments of the present invention will now be described with reference to the accompanying drawings applied to a portable computer.

Figure 1:
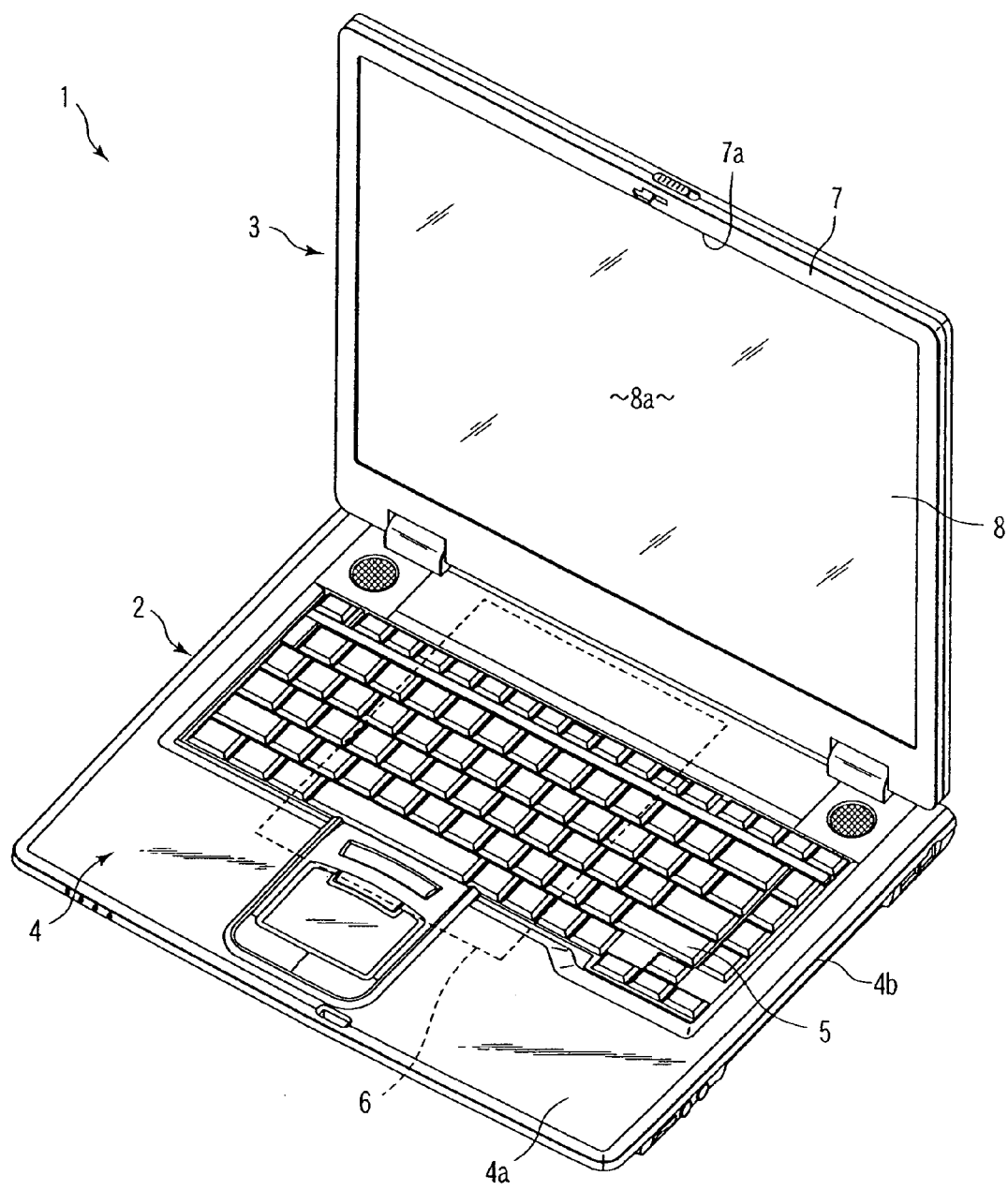
FIG. 1 is an exemplary perspective view of a portable computer according to a first embodiment of the invention.

FIGS. 1 to 10 show a portable computer 1 as an electronic device according to one embodiment of the present invention. As shown in FIG. 1, the portable computer 1 includes a body 2 and a display unit 3.

The body 2 is provided with a box-shaped case 4. The case 4 includes a top wall 4a, a side wall 4b, and a bottom wall (not shown). The top wall 4a of the case 4 supports a keyboard 5. The case 4 contains a printed circuit board 6 therein.

The display unit 3 includes a display housing 7 and a liquid crystal display module 8 contained in the housing 7. The display module 8 has a display screen 8a. The display screen 8a is exposed to the outside of the display housing 7 through an opening 7a in the front face of the housing 7.

The display unit 3 is supported on a rear end portion of the case 4 by a hinge device. Thus, the display unit 3 is rockable between a closed position in which it is lowered to cover the top wall 4a from above and an open position in which the unit 3 is raised to expose the top wall 4a.

Figure 2:
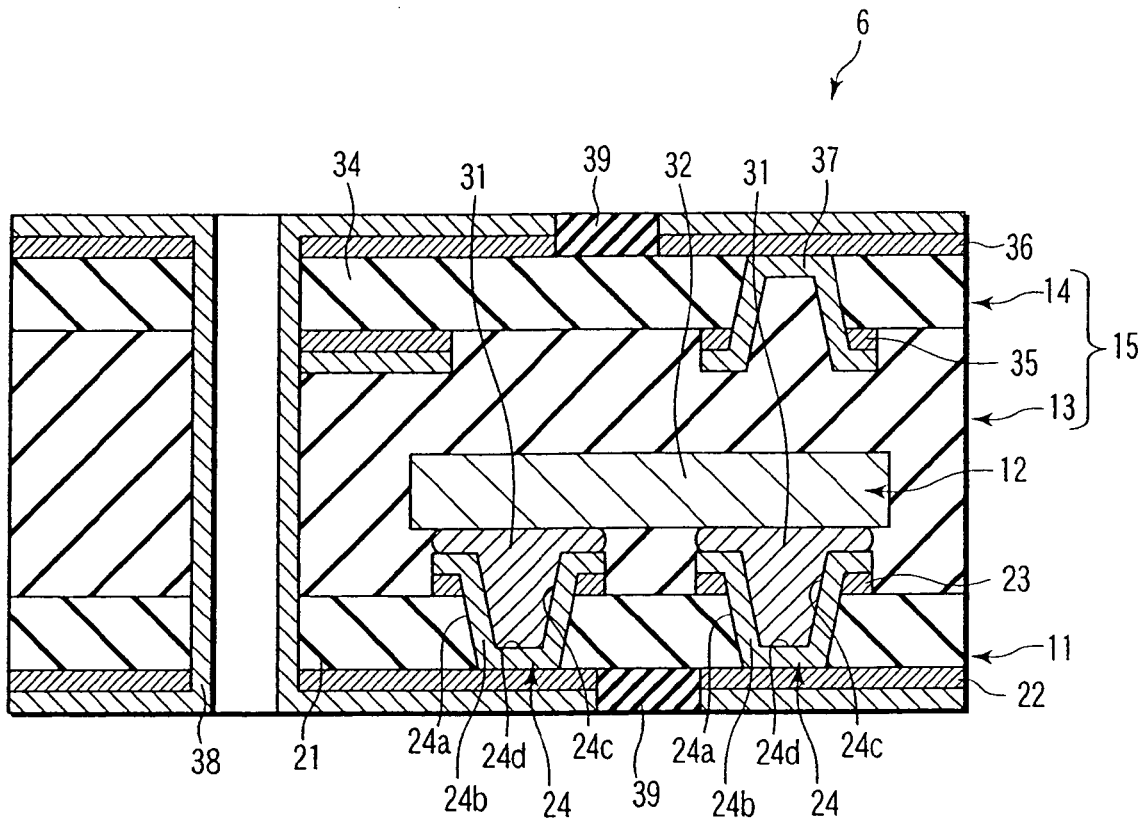
FIG. 2 is an exemplary sectional view typically showing a printed circuit board according to the first embodiment.

FIG. 2 typically shows a configuration of the printed circuit board 6. The circuit board 6 is a multilayer printed circuit board. The circuit board 6 includes a first laminate member 11, circuit component 12, dielectric member 13, and second laminate member 14.

The first laminate member 11 is an example of a first dielectric layer, which includes a first core member 21. The first laminate member 11 is provided with first and second conductive patterns 22 and 23 and via holes 24. The first core member 21 is formed of a dielectric material, e.g., a woven glass fabric or paper impregnated with a resin material such as an epoxy, polyimide, or BT resin.

The first conductive pattern 22 is formed on the lower surface of the first core member 21. The second conductive pattern 23 is formed on the upper surface of the core member 21. The first and second conductive patterns 22 and 23 are formed of, for example, a copper foil each. Each of the conductive patterns 22 and 23 constitutes a part of an electric circuit of the printed circuit board 6.

As shown in FIG. 2, the via holes 24 are situated corresponding to the second conductive pattern 23 and open at a surface of the first laminate member 11. A plurality of bumps 31 are formed on the circuit component 12. The via holes 24 are as many as the bumps 31. Each via hole 24 has an opening 24a and a plating layer 24b. The opening 24a is formed ranging from the upper surface of the second conductive pattern 23 to the lower surface of the first core member 21.

The plating layer 24b is an example of a conductive layer. The plating layer 24b is formed covering the inner surface of the opening 24a, the upper surface of the first conductive pattern 22, and the upper and side surfaces of the second conductive pattern 23. Thus, each the plating layer 24b of the via holes 24 is connected electrically to at least any one of the first and second conductive patterns 22 and 23. The plating layer 24b, in conjunction with the second conductive pattern. 23, functions as a connecting conductor on which the circuit component 12 is mounted. The surface of the plating layer 24b forms an inner surface 24c of each via hole 24. The inner surface 24c of the via hole 24 forms a bottom surface 24d on the upper surface of the first conductive pattern 22.

The first dielectric layer is not limited to the configuration of the first laminate member 11 according to the present embodiment. For example, alternative conductive patterns or via holes 24 that constitute a part of each electric circuit may be provided on the upper or lower surface of the first core member 21. The plating layer 24b may be configured to serve singly as a connecting conductor on which the circuit component 12 is mounted without the use of the second conductive pattern 23.

As shown in FIG. 2, the circuit component 12 is set on the first laminate member 11. An example of the circuit component 12 is an IC chip. The component 12 includes the bumps 31 and a component body 32. The component body 32 includes, for example, a semiconductor that activates the component 12 and a mold that encloses the semiconductor.

The circuit component 12 may be either an active element, such as an IC or LSI chip, or a passive element, such as a chip resistor or chip capacitor. Further, the IC or LSI chip may be of any type, either a bare chip or a package-type chip, such as a ball grid array (BGA).

The bumps 31 are protrusions that are arranged in a lattice on the lower surface of the component body 32. Although the bumps 31 according to the present embodiment are formed of, for example, gold (Au), they may alternatively be formed of a conductive material such as solder. The lower end portion of each bump 31 is inserted in its corresponding via hole 24 and bonded to the inner surface 24c of the hole 24.

As shown in FIG. 2, the dielectric member 13 is laminated to the first laminate member 11 so as to cover the circuit component 12. The dielectric member 13 is formed of an epoxy resin or the like that is highly doped with, for example, silica gel.

The second laminate member 14 is laminated to the dielectric member 13 so that the dielectric member 13 is sandwiched between the first and second laminate members 11 and 14. In the present embodiment, the dielectric member 13 and the second laminate member 14 join together to form an example of a second dielectric layer 15. The second laminate member 14 includes a second core member 34, third and fourth conductive patterns 35 and 36, and a via hole 37.

Like the first core member 21, the second core member 34 is formed of a dielectric material. The third conductive pattern 35 is formed on the lower surface of the second core member 34. The fourth conductive pattern 36 is formed on the upper surface of the second core member 34. The third and fourth conductive patterns 35 and 36 are formed of, for example, a copper foil each. Each of the conductive patterns 35 and 36 constitutes a part of an electric circuit of the printed circuit board 6.

As shown in FIG. 2, the printed circuit board 6 further includes a through hole 38 and a solder resist layer 39. The through hole 38 includes an opening that penetrates the printed circuit board 6 and a plating layer and constitutes a part of an electric circuit of the circuit board 6. The solder resist layer 39 is provided on the outermost layer of the printed circuit board 6.

A manufacturing method for the printed circuit board 6 according to a first embodiment of the present invention will now be described with reference to FIGS. 3 to 10.

Figure 3:
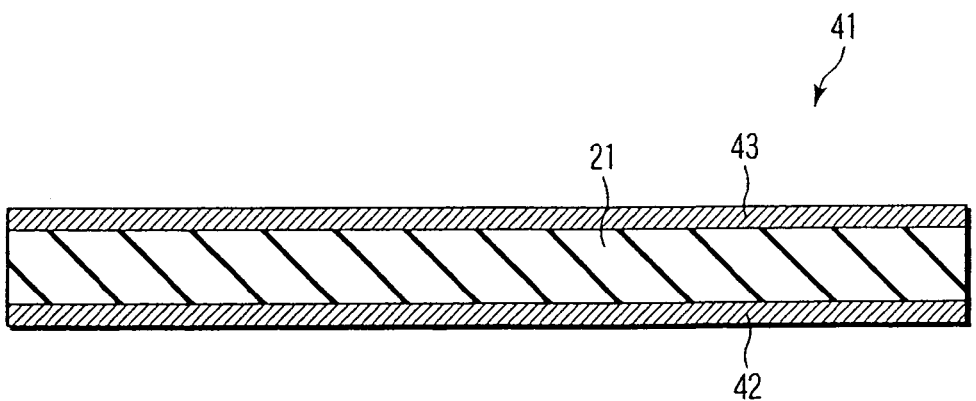
FIG. 3 is an exemplary sectional view of a base of a first laminate member according to the first embodiment.

FIG. 3 shows a base 41 as a basis for the first laminate member 11. The base 41 includes the first core member 21 and first and second conductive layers 42 and 43 provided individually on the obverse and reverse surfaces of the core member 21.

Figure 4:
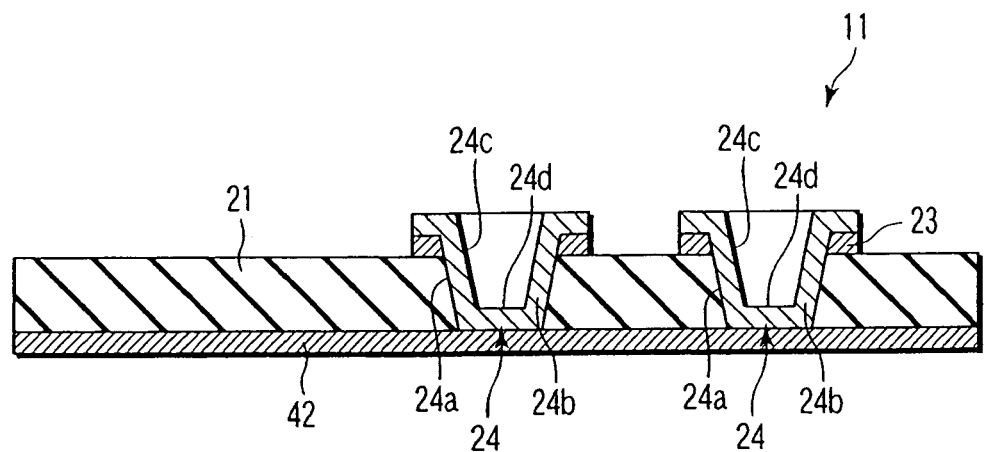
FIG. 4 is an exemplary sectional view of the first laminate member according to the first embodiment.

First, a first process is performed to form the first laminate member 11 from the base 41. In the first process, as shown in FIG. 4, the second conductive layer 43 on the upper surface of the first core member 21 is pattern-etched. By doing this, the second conductive pattern 23 is formed from the second conductive layer 43. Further, the opening 24a of each via hole 24 is bored through the first core member 21 by means of, for example, a $CO_2$ laser, UV laser, or drill. The plating layer 24b is formed on the inner surface of the bored opening 24a. Thereupon, the first laminate member 11 is formed.

Figure 5:
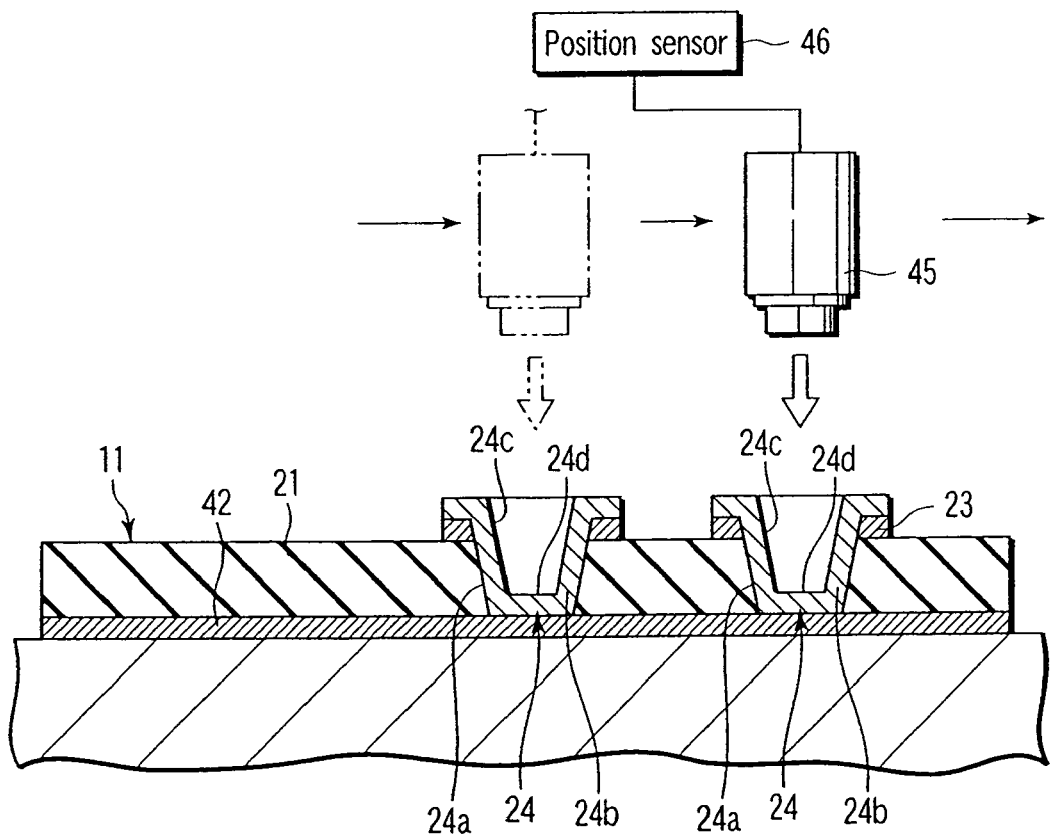
FIG. 5 is an exemplary sectional view showing a position detection process for via holes according to the first embodiment.

The opening position of each via hole 24 varies with each laminate member depending on manufacturing errors. After the first process, a second process is performed to detect the opening position of each via hole 24 in the first laminate member 11. As shown in FIG. 5, position information on each via hole 24 is acquired by using a CCD camera 45, for example. The CCD camera 45 is an example of an image-pickup device. The camera 45 is situated above the first laminate member 11 and is movable along the surface of the member 11. The camera 45 is fitted with a position sensor 46 for measuring its position.

In the second process, the CCD camera 45 is moved so as to scan the entire surface of the first laminate member 11. The camera 45 detects, for example, positions of four sides of the first laminate member 11 and the opening position of each via hole 24. Thus, some pieces of information can be acquired, including coordinates of each via hole 24 in the first laminate member 11, distances between the via holes 24, etc.

On the other hand, the position in which each bump 31 is formed varies with each circuit component 12 depending on manufacturing errors. Thereupon, a third process is performed to detect the position of each bump 31. This third process may be performed either after or before the second process. Further, the second and third processes may be simultaneously carried out with use of a plurality of CCD cameras 45.

As shown in FIG. 6, a plurality of circuit components 12 are prepared side by side on a manufacturing line for the printed circuit board 6. The components 12 are held upside down so that the bumps 31 are situated above each component body 32. In the description of the present embodiment to follow, a convex gold bump will be given as an example of each bump 31.

In the third process, the CCD cameras 45 are moved so as to scan the entire circuit components 12. Each camera 45 detects, for example, the positions of four sides of each component body 32 and the positions in which the bumps 31 are formed. Thus, some pieces of information can be acquired, including coordinates of each bump 31 in the component body 32, distances between the bumps 31, etc. This operation for detecting the position information on the bumps 31 is performed for all (or plurality) of the prepared circuit components 12.

Then, a fourth process is performed to select any of the circuit components 12. In the fourth process, the circuit component 12 having the bumps 31 in positions that are relatively coincident with (i.e. suitable for) the specific target via holes 24 in the first laminate member 11 is selected. In the present embodiment, "coincident" implies that the bumps 31 are arranged at intervals that are relatively equivalent to the distances between the via holes 24. In other words, it is indicated that the via holes 24 and bumps 31 are arranged at similar pitches.

Figure 7:
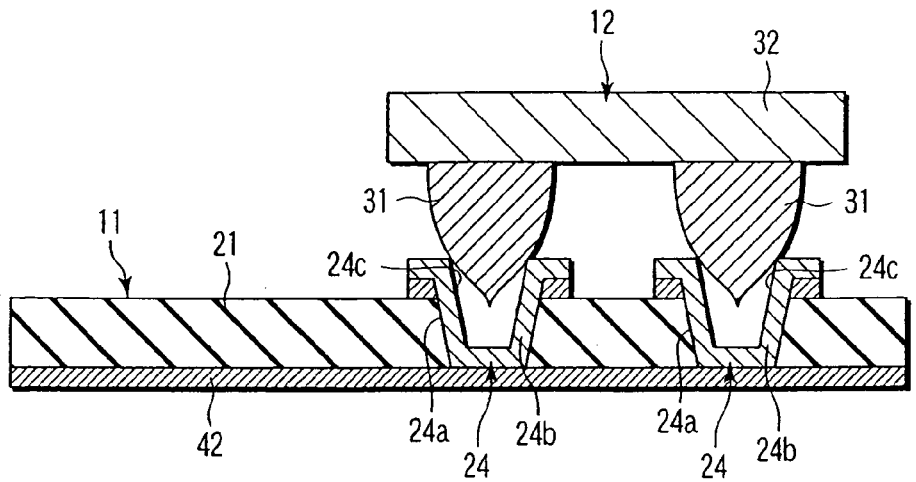
FIG. 7 is an exemplary sectional view showing a process for mounting a circuit component on the first laminate member according to the first embodiment.
Figure 8:
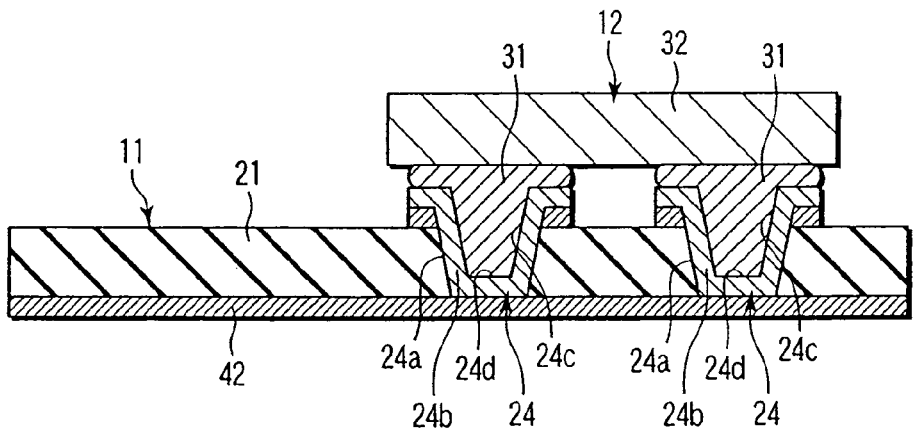
FIG. 8 is an exemplary sectional view showing a process for bonding the circuit component to the first laminate member according to the first embodiment.

After the fourth process, a fifth process is performed to mount the selected circuit component 12 on the first laminate member 11. As shown in FIG. 7, the circuit component 12 is first set on the via holes 24. Each bump 31 has a shape different from that of each via hole 24. After the component 12 is set in this manner, a given downward pressure and given heat are applied to the component 12. If the pressure is applied to the circuit component 12, the convex bumps 31 are plastically deformed to be fitted into their corresponding via holes 24 along the shapes of the holes, as shown in FIG. 8. Thus, the bumps 31 are bonded individually to the respective inner surfaces 24c of the via holes 24.

After the fifth process, a sixth process is performed to laminate the dielectric member 13 and the second laminate member 14. The second laminate member 14 is separately formed in a process similar to the first process. In this sixth process, the dielectric member 13 is kept in a semi-hardened, fluid state without being fully hardened. In the sixth process, the dielectric member 13 is put on the first laminate member 11, and the second laminate member 14 on the dielectric member 13. In this state, given temperature and pressure are applied for laminate pressing. Thus, the dielectric member 13 covers the circuit component 12 when it is hardened. In consequence, the first laminate member 11, dielectric member 13, and second laminate member 14 form one plate-like member.

Figure 9:
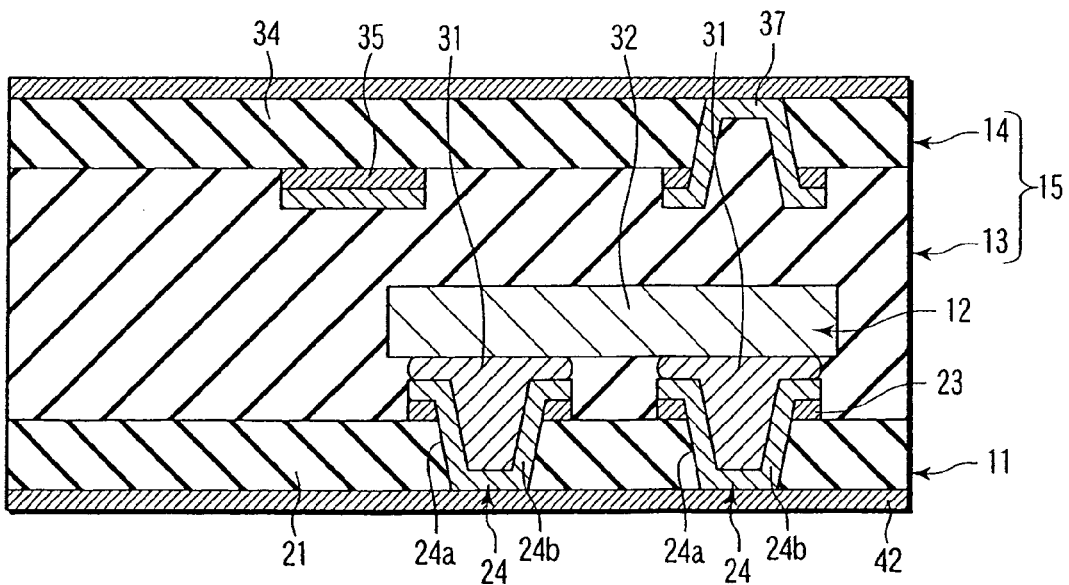
FIG. 9 is an exemplary sectional view showing a process for laminating a second laminate member to the first laminate member according to the first embodiment.

A seventh process is performed. In the seventh process, as shown in FIG. 9, the through hole 38 is formed in each necessary position and subjected to pattern-etching. Thereupon, the first and fourth conductive patterns 22 and 36 are formed. Finally, the solder resist layer 39 is formed. If necessary, moreover, various circuit components (not shown) are mounted. The printed circuit board 6 shown in FIG. 2 is manufactured by performing these processes.

According to the printed circuit board 6 constructed in this manner, the bond strength of the circuit components on the conductors that are formed on the dielectric layers can be enhanced. Specifically, the bumps 31 are inserted individually into the via holes 24 and bonded to their respective inner surfaces 24c. As compared with the bond area between conventional bumps and pads, therefore, a larger bond area can be secured between the bumps 31 and the via holes 24 as connecting conductors. Thus, the bond strength, for example the shear strength, of the circuit component 12 on the first laminate member 11 can be enhanced.

The circuit component 12 according to the present embodiment can stand a pressure, if any, applied thereto as the dielectric member 13 is laminated to it.

Thus, the yield of production and reliability of the printed circuit board 6 with built-in components can be improved. Since the portable computer 1 is mounted on the printed circuit board 6 constructed in this manner, moreover, the yield of production and reliability of the computer 1 itself can be improved.

With use of the second laminate member 14 and the dielectric member 13, a complicated electric circuit can be formed of the second laminate member 14. Further, the dielectric member 13 can be used securely to cover the circuit component 12.

If each via hole 24 has the bottom surface 24d, each bump 31 is also bonded to the bottom surface 24d. Therefore, the bond strength between the bumps 31 and the via holes 24 can be enhanced. If each via hole 24 has the bottom surface 24d, moreover, the via hole 24 can be easily filled tight with the bump 31. Thus, the reliability of connection is improved.

If each bump 31 that is initially formed having a shape different from that of each via hole 24 is plastically deformed as it is filled into the via hole 24, the bump 31 can be formed with ease. Further, each bump 31 can be securely bonded to the inner surface 24c of its corresponding via hole 24.

Figure 10:
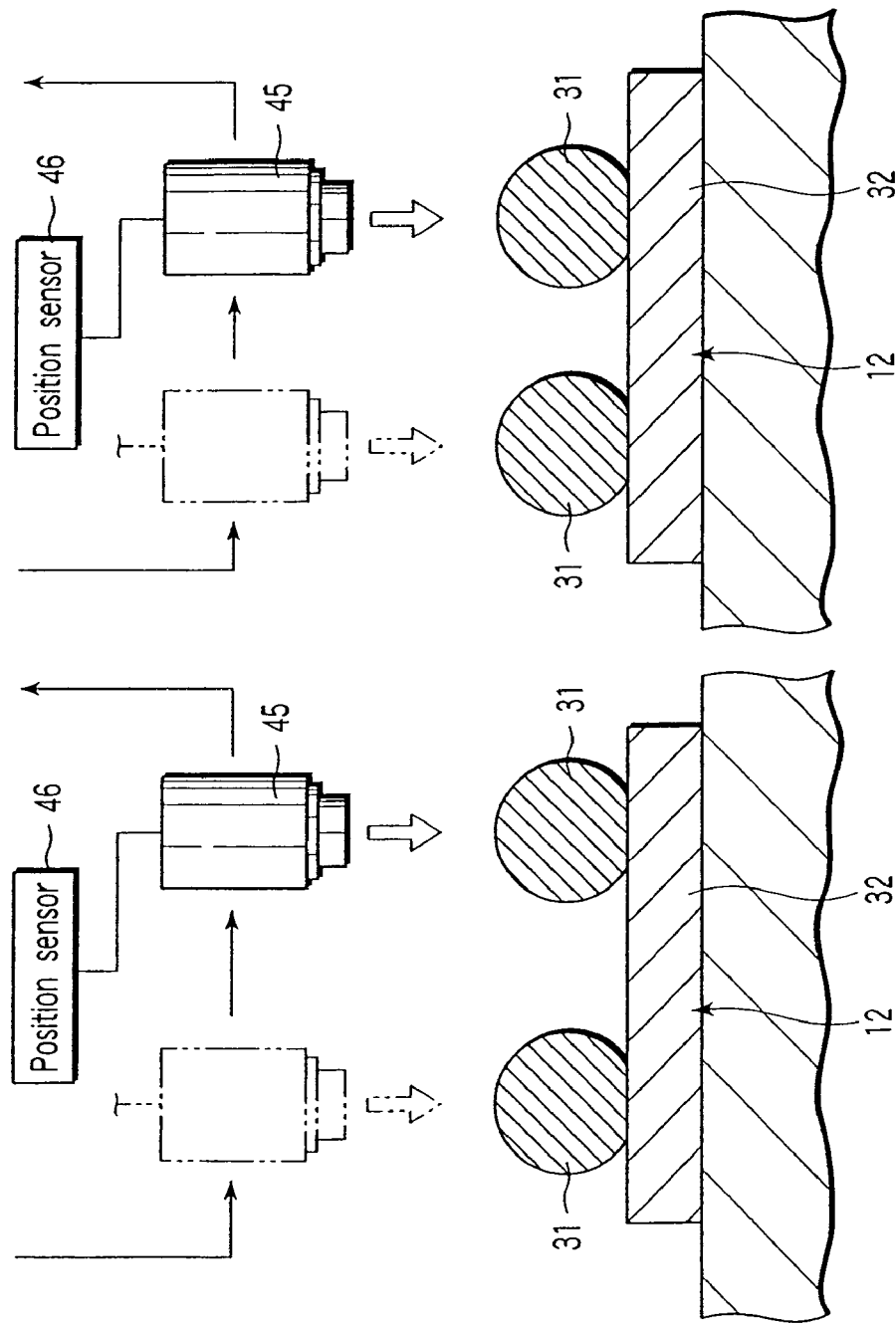
FIG. 10 is an exemplary sectional view showing a modification of bumps according to the first embodiment.

Each bump 31 is not limited to the convex shape but may be formed having any other shape, such as the one shown in FIG. 10. Further, the material of each bump 31 is not limited to gold. As shown in FIG. 10, for example, the bumps 31 may be spherical solder bumps. Each solder bump 31 is filled into its corresponding via hole 24 by being melted in the fifth process. The same effect as that of the gold bumps can be obtained with these solder bumps 31. The material of the bumps 31 is not limited to gold or solder but may be any other material that is conductive.

Each via hole 24 need not always have the bottom surface 24d but may be formed of a through hole that opens to the outside of the printed circuit board 6. Even with use of this via hole, the bond strength between the bump 31 and the via hole can be enhanced as the bump is bonded to the inner surface 24c of the via hole.

The second dielectric layer 15 need not always have the second laminate member 14. It may alternatively be obtained by forming a conductive pattern directly on the dielectric member 13 with use of, for example, a conductive transfer base. The printed circuit board 6 may further have additional dielectric layers and conductive layers outside the first and second laminate members 11 and 14.

According to the manufacturing method for the printed circuit board 6 arranged in this manner, a large bond area can be secured between the bumps 31 and the via holes 24. Thus, the bond strength of the circuit component 12 on the first laminate member 11 can be enhanced.

The via holes 24 and the bumps 31 are subject to manufacturing errors. If an attempt is made to mount any randomly selected circuit component 12 on the via holes 24 without detecting the respective opening positions of the holes 24, therefore, the opening positions of the holes sometimes may fail to be coincident with the positions in which the bumps 31 are formed.

According to the manufacturing method of the present embodiment, however, the bumps 31 can be mounted without deviation in the via holes 24. Even if the positions of the holes 24 and the bumps 31 are subject to manufacturing errors, selecting circuit component 12 which is formed with the bumps 31 that are aligned with the via holes 24 inproves the yield of production of the printed circuit board 6. If the respective positions of the via holes 24 and the bumps 31 are coincident with one another, the bond strength between them is also enhanced.

If the selected circuit component 12 is formed with the bumps 31 that are arranged at intervals that are most approximate to the distances between the via holes 24, in particular, the bumps 31 can be inserted securely into the via holes 24.

The method of detecting the respective positions of the via holes 24 and the bumps 31 using the CCD cameras 45 or other image-pickup devices is simpler than any other method. The detection of the positions of the via holes 24 and the bumps 31 are not limited to the method based on the image-pickup devices. For example, the positions may be detected by laser detectors, and any detection methods may be used only if they can detect indentations.

The printed circuit board 6 with built-in components can be manufactured by further laminating additional dielectric layers after the circuit component 12 is on the first laminate member 11.

A manufacturing method for a printed circuit board 6 according to a second embodiment of the present invention will now be described with reference to FIGS. 11 to 14, as well as to FIGS. 3, 4, 7 and 9 for the first embodiment. Processes common to the manufacturing methods of the first and second embodiments will be specified without explanation. The manufacturing method according to the present invention shares the first, fifth, sixth, and seventh processes with the manufacturing method according to the first embodiment.

Figure 11:
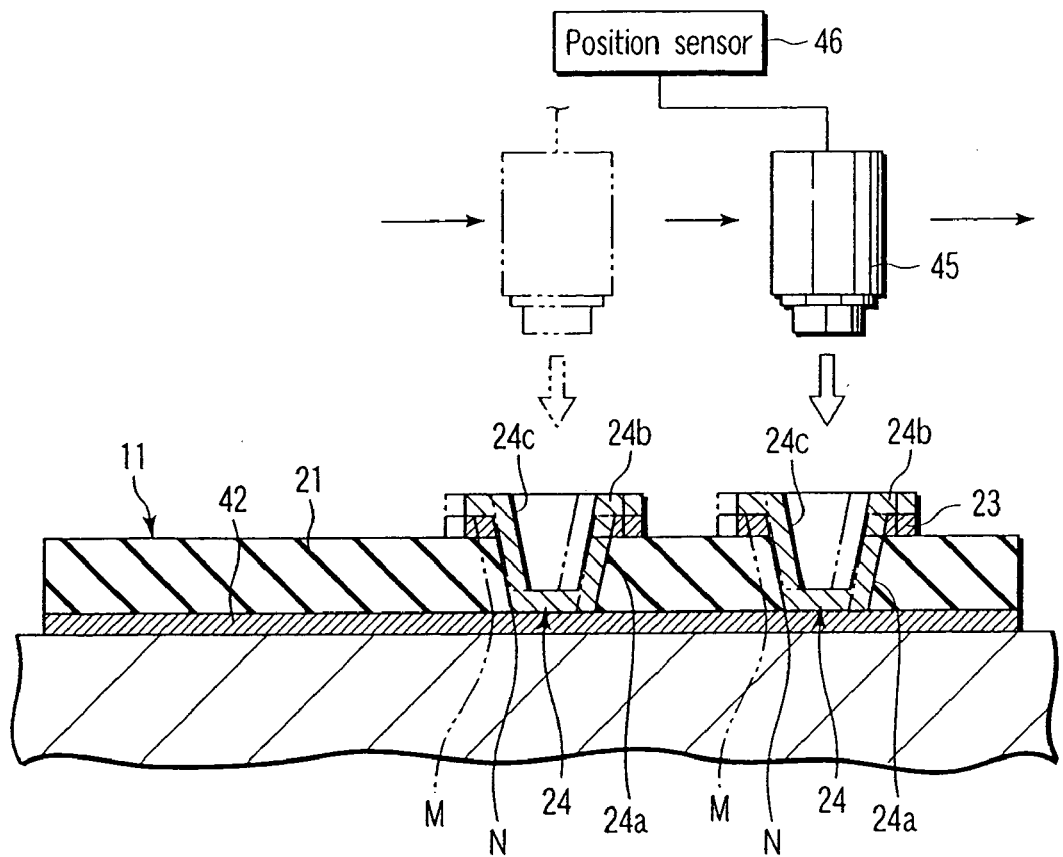
FIG. 11 is an exemplary sectional view showing a position detection process for via holes according to a second embodiment of the invention.

After the first process, a second process is performed to detect the opening positions of the via holes 24 in the first laminate member 11. In the second process, as shown in FIG. 11, positions of four sides of the first laminate member 11 and the opening positions of the via holes 24 are detected by, for example, the CCD camera 45. Thereupon, some pieces of information are acquired, including coordinates of each via hole 24 in the first laminate member 11, the direction and amount of eccentricity between a desired position M in which each via hole 24 should primarily be located and a position N in which each hole 24 is actually located, etc.

Figure 12:
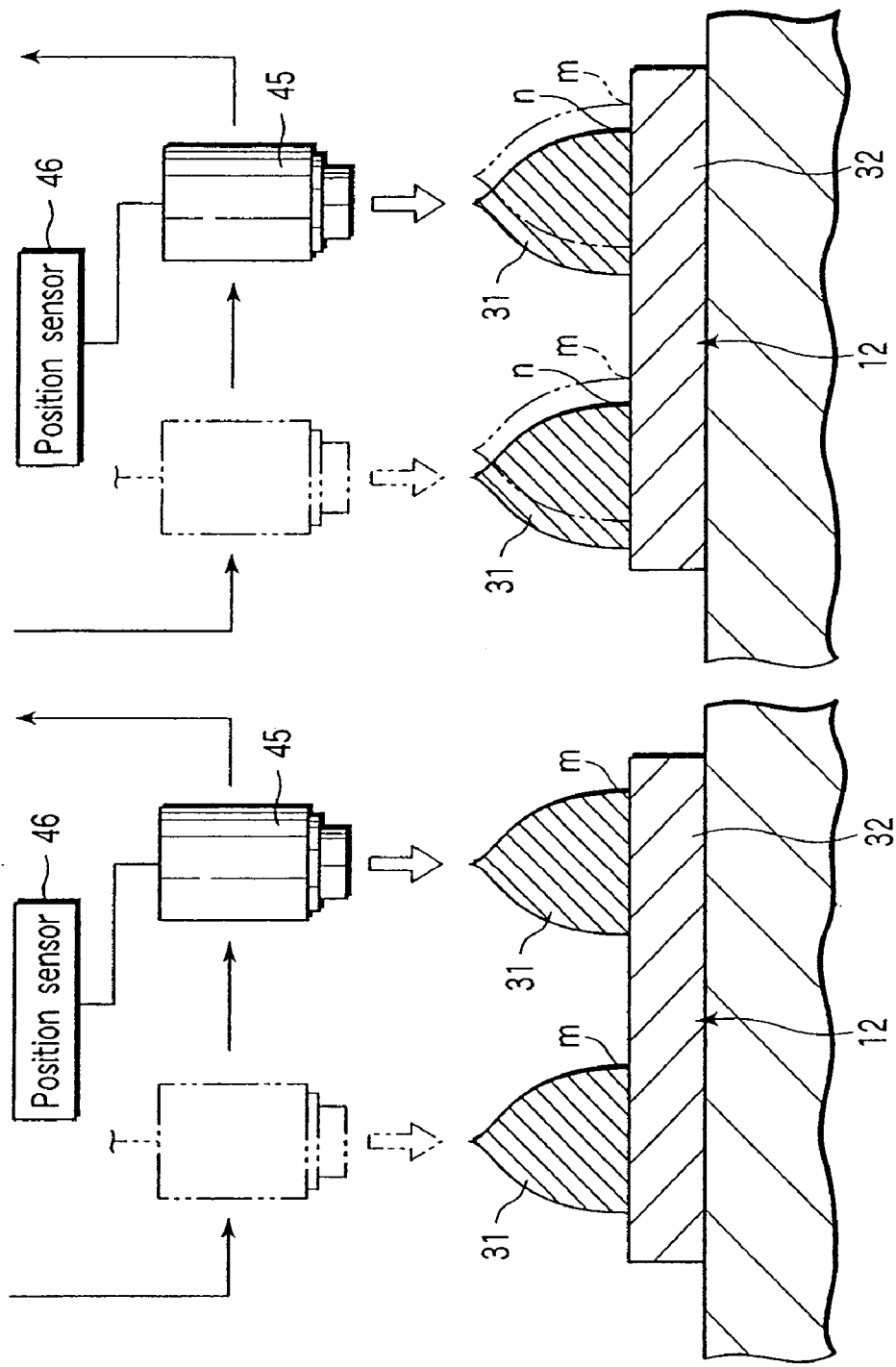
FIG. 12 is an exemplary sectional view showing a position detection process for bumps according to the second embodiment.

Further, a third process is performed to detect the position of each bump 31. As in the first embodiment, the third process may be performed either after or before the second process. Further, the second and third processes may be carried out simultaneously. In the third process, as shown in FIG. 12, positions of four sides of each component body 32 and the positions in which the bumps 31 are formed are detected by the CCD camera 45. Thereupon, some pieces of information are acquired, including coordinates of each bump 31 in the circuit component 12, the direction and amount of eccentricity between a desired position m in which each bump 31 should primarily be located and a position n in which each bump 31 is actually located, etc.

Then, a fourth process is performed to select any of the circuit components 12. In the fourth process, the circuit component 12 having the bumps 31 in positions that are relatively coincident with the specific target via holes 24 in the first laminate member 11 is selected. In the present embodiment, "coincident" implies that the bumps 31 are made eccentric to cancel the eccentricity of each via hole 24 in the case where the via hole 24 is located eccentrically to the position in which it should primarily be formed.

Figure 13:
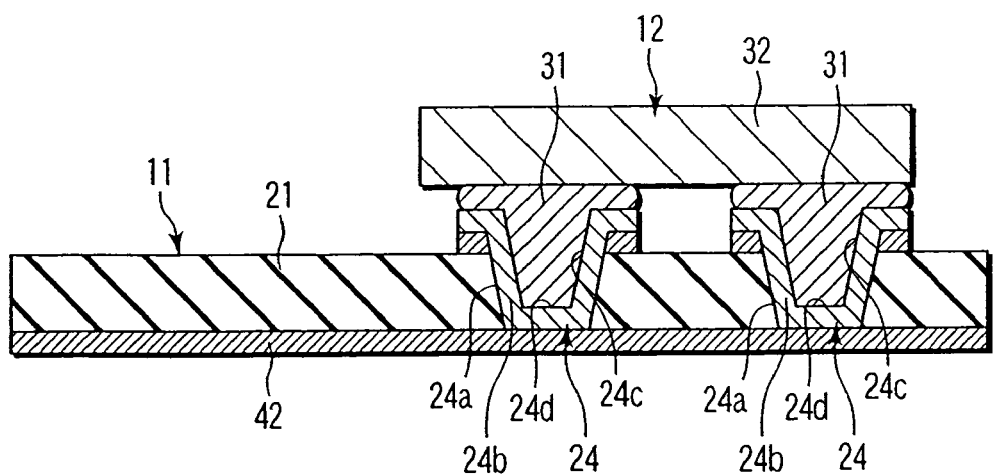
FIG. 13 is an exemplary sectional view showing a first laminate member and a circuit component according to the second embodiment.
Figure 14:
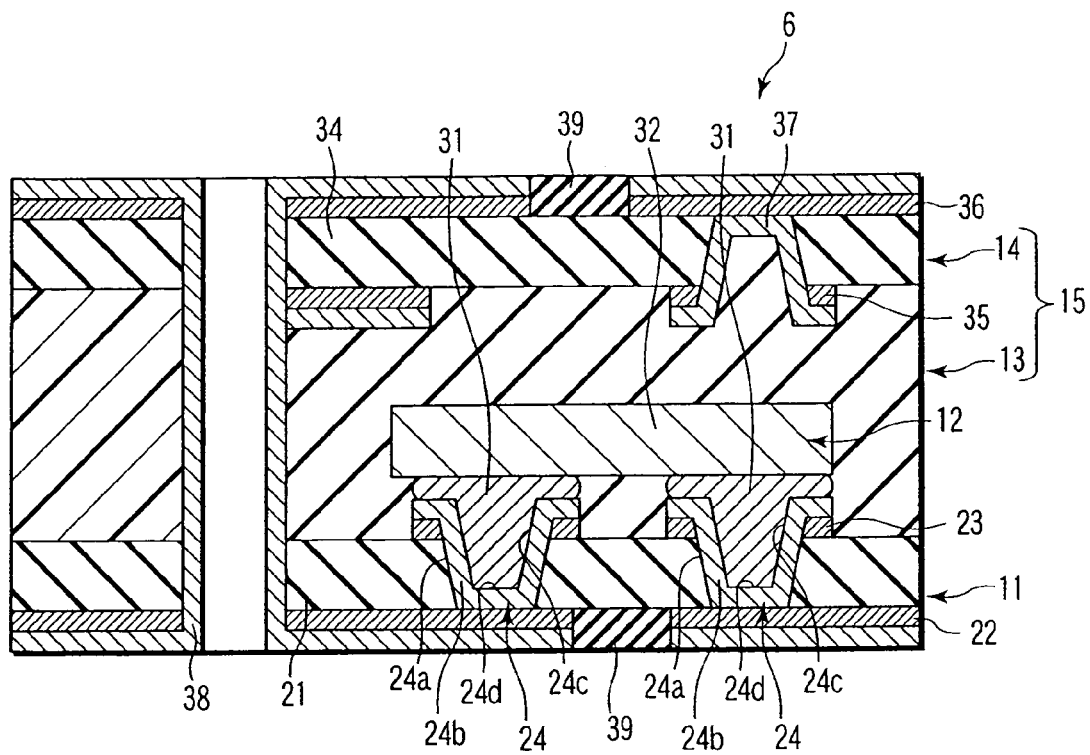
FIG. 14 is an exemplary sectional view showing a printed circuit board according to the second embodiment.

For example, for each via hole 24 that is formed in the position N rightwardly eccentric to the desired position M, as shown in FIG. 11, the circuit component 12 is selected that is provided with the bumps 31 that are each formed in the position n that is leftwardly eccentric to the desired position m (on the side opposite from the direction of eccentricity of the position N), as shown in FIG. 12. Even if the positions of the via holes 24 are eccentric, for example, the component body 32 of the circuit component 12 can be located in the desired position in which it should primarily be located, as shown in FIG. 13, by combining these via holes and bumps. Thereupon, the printed circuit board 6 is formed, as shown in FIG. 14.

According to the manufacturing method for the printed circuit board 6 arranged in this manner, a large bond area can be secured between the bumps 31 and the via holes 24. Thus, the bond strength of the circuit component 12 on the first laminate member 11 can be enhanced. Even if the positions of the via holes 24 and the bumps 31 are subject to manufacturing errors, moreover, the bumps 31 can be mounted without deviation in the via holes 24.

If the selected circuit component 12 is formed with the bumps 31 that are made eccentric to cancel the eccentricity of the via holes 24, for example, the component body 32 of the component 12 can be located in a desired position. The bumps 31 may be spherical solder bumps, as shown in FIG. 10.

Figure 15:
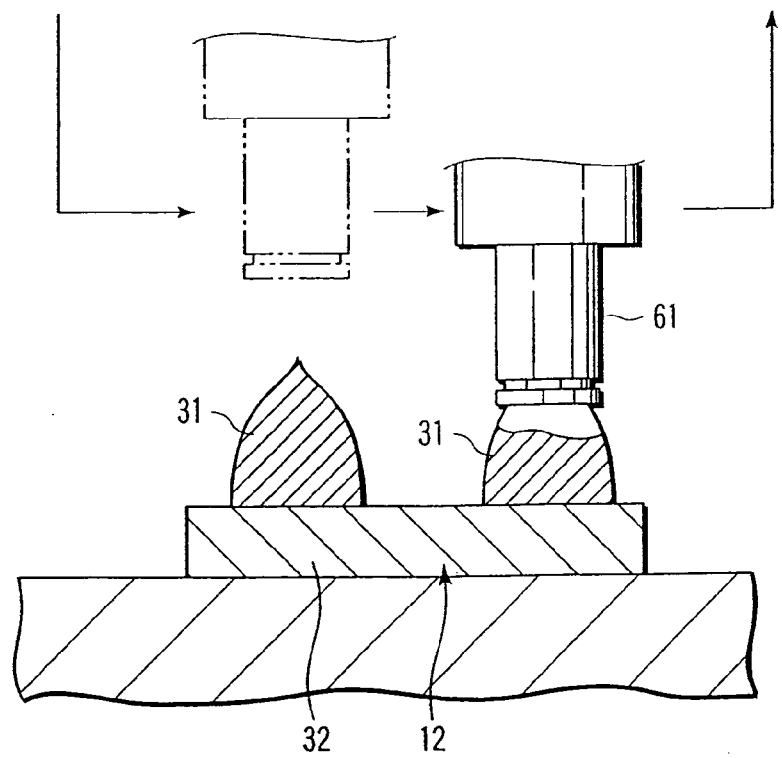
FIG. 15 is an exemplary sectional view showing a bump forming process according to a third embodiment of the invention.

A manufacturing method for a printed circuit board 6 according to a third embodiment of the present invention will now be described with reference to FIG. 15, as well as to FIGS. 3 to 5 and FIGS. 7 to 9 for the first embodiment. Processes common to the manufacturing methods of the first and third embodiments will be specified without explanation. The manufacturing method according to the present invention shares the first and second processes with the manufacturing method according to the first embodiment.

After the second process, a third process is performed to the form the bumps 31. In the third process, as shown in FIG. 15, the bumps 31 are formed on the component body 32 by using a bump forming apparatus 61. In this process, the bumps 31 are formed so as to be in positions that are relatively coincident with the opening positions of the via holes 24. In the present embodiment, "coincident" implies that the bumps 31 are formed at intervals that are relatively equivalent to the distances between the via holes 24. In other words, it is indicated that the bumps 31 are formed so that the pitches of the via holes 24 and the bumps 31 are similar.

After the third process, a fourth process is performed to mount the circuit component 12 with the bumps 31 on the first laminate member 11. Further, a process for laminating the dielectric member 13 and the second laminate member 14 and other processes are performed, whereupon the printed circuit board 6 is formed.

According to the manufacturing method for the printed circuit board 6 arranged in this manner, a large bond area can be secured between the bumps 31 and the via holes 24. Thus, the bond strength of the circuit component 12 on the first laminate member 11 can be enhanced. Even if the positions of the via holes 24 are subject to manufacturing errors, moreover, the bumps 31 can be mounted without deviation in the via holes 24.

If the bumps 31 are formed at intervals that are equivalent to the distances between the via holes 24, in particular, the bumps 31 can be inserted securely into the via holes 24.

Figure 16:
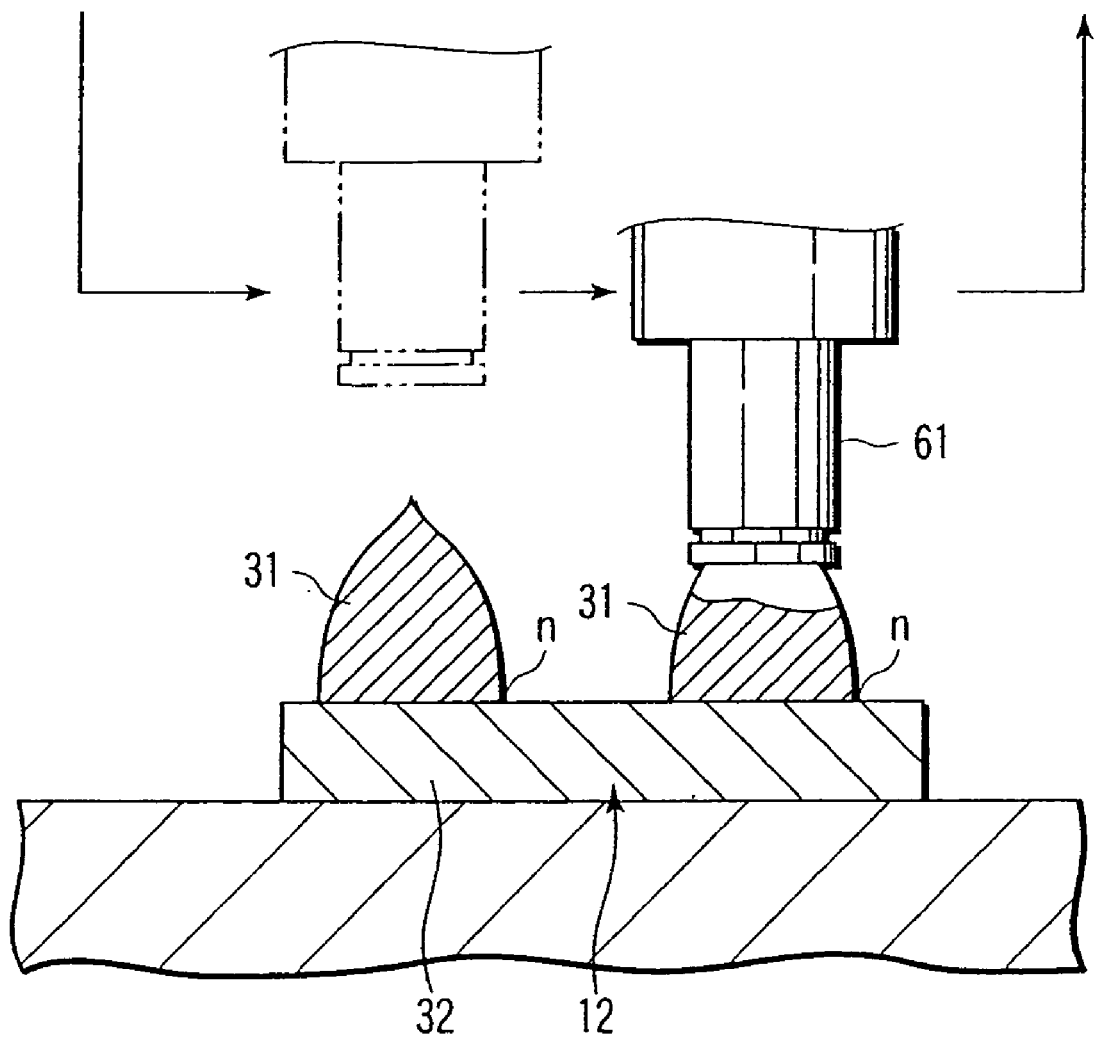
FIG. 16 is an exemplary sectional view showing a bump forming process according to a fourth embodiment of the invention.

A manufacturing method for a printed circuit board 6 according to a fourth embodiment of the present invention will now be described with reference to FIG. 16, as well as to FIGS. 3, 4, 7, 9, 11, 13 and 14 for the first and second embodiments. Processes common to the manufacturing methods of the second and fourth embodiments will be specified without explanation. The manufacturing method according to the present invention shares the first and second processes with the manufacturing method according to the second embodiment.

After the second process, a third process is performed to the form the bumps 31. As shown in FIG. 16, the bumps 31 are formed so as to be in positions that are relatively coincident with the opening positions of the via holes 24. In the present embodiment, "coincident" implies that the bumps 31 are made eccentric to cancel the eccentricity of each via hole 24 in the case where the via hole 24 is located eccentrically to the desired position in which it should primarily be formed.

After the third process, a fourth process is performed to mount the circuit component 12 with the bumps 31 on the first laminate member 11. Further, a process for laminating the dielectric member 13 and the second laminate member 14 and other processes are performed, whereupon the printed circuit board 6 is formed.

According to the manufacturing method for the printed circuit board 6 arranged in this manner, a large bond area can be secured between the bumps 31 and the via holes 24. Thus, the bond strength of the circuit component 12 on the first laminate member 11 can be enhanced. Even if the positions of the via holes 24 are subject to manufacturing errors, the bumps 31 can be mounted without deviation in the via holes 24.

Since the bumps 31 are made eccentric so as to cancel the eccentricity of the opening positions of the via holes 24, in particular, the component body 32 of the circuit component 12 can be located in the desired position.

Although there have been described the printed circuit boards 6 according to the one embodiment and the manufacturing methods for the printed circuit board 6 according to the first to fourth embodiments, the present invention is not limited to these embodiments. For example, the coincidence of the positions of the bumps 31 with the opening positions of the via holes 24 is not limited to the approximation of their pitches or amounts of eccentricity, but any other criterion may be provided for the purpose. Further, a plurality of criteria may be used in combination with one another.

The manufacturing methods according to the first to fourth embodiments are not limited to the manufacture of the printed circuit board 6 with built-in components. A conventional printed board without built-in components in which the bumps 31 are mounted in the via holes 24 can be manufactured by performing the first to fifth processes according to the first and second embodiments or the first to fourth processes according to the third and fourth embodiments. Electronic devices to which the present invention is applicable include any other types of devices than portable computers, including cell phones, digital cameras, personal digital assistants, etc.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A manufacturing method for a printed circuit board, comprising:

preparing a dielectric layer comprising a plurality of electrically conductive portions for mounting a circuit component thereto, wherein the plurality of conductive portions of the dielectric layer comprise via holes in the dielectric layer, the via holes having conductive surfaces;

providing a plurality of circuit components, each of the plurality of circuit components comprising a plurality of electrically conductive portions for connecting the circuit component to the plurality of conductive portions of the dielectric layer, wherein the plurality of conductive portions of each of the plurality of circuit components comprise conductive protrusions from the plurality of circuit components;

detecting the positions of the plurality of conductive portions of the dielectric layer;

detecting the positions of the plurality of conductive portions of each of the plurality of circuit components;

selecting one of the plurality of circuit components whose plurality of conductive portions are situated in positions suitable for the plurality of conductive portions of the dielectric layer, wherein the selected circuit component comprises the conductive protrusions arranged at intervals which are relatively equivalent to distances between the via holes; and mounting the selected circuit component on the dielectric layer so that the plurality of conductive portions of the selected circuit component are aligned with the plurality of conductive portions of the dielectric layer, and bonding the selected circuit component to the plurality of conductive portions of the dielectric layer.

2. A manufacturing method for a printed circuit board, comprising:

preparing a dielectric layer comprising a plurality of electrically conductive portions for mounting a circuit component thereto;

providing a plurality of circuit components, each of the plurality of circuit components comprising a plurality of electrically conductive portions for connecting the circuit component to the plurality of conductive portions of the dielectric layer;

detecting the positions of the plurality of conductive portions of the dielectric layer;

detecting the positions of the plurality of conductive portions of each of the plurality of circuit components;

selecting one of the plurality of circuit components whose plurality of conductive portions are situated in positions suitable for the plurality of conductive portions of the dielectric layer, wherein the selected circuit component is selected based on the positions of its plurality of conductive portions having one or more offsets from desired positions that cancel one or more offsets from desired positions of the plurality of conductive portions of the dielectric layer, the offsets of the plurality of conductive portions of the dielectric layer and of the selected circuit component resulting from fabrication tolerances; and mounting the selected circuit component on the dielectric layer so that the plurality of conductive portions of the selected circuit component are aligned with the plurality of conductive portions of the dielectric layer, and bonding the selected circuit component to the plurality of conductive portions of the dielectric layer.

3. A printed circuit board comprising:

a first dielectric layer with a plurality of electrically conductive portions for mounting a circuit component thereto, and a first conductive pattern connected electrically to one or more of the conductive portions of the first dielectric layer, wherein the plurality of conductive portions of the first dielectric layer comprise a plurality of via holes, each of the plurality of via holes having an opening at a surface thereof and a conductive layer formed on a surface thereof;

a circuit component with a plurality of electrically conductive portions mounted to the plurality of conductive portions of the dielectric layer, the circuit component being selected from a plurality of circuit components based at least in part on the degree to which detected locations of the plurality of conductive portions of the circuit component correspond to detected locations of the plurality of conductive portions of the first dielectric layer, and wherein the plurality of conductive portions of the circuit component comprise a plurality of protrusions, at least a part of each of which is inserted in one of the plurality of via holes and bonded to an inner surface of one of the plurality of via holes; and a second dielectric layer provided with a second conductive pattern and laminated to the first dielectric layer to cover the circuit component.

4. A printed circuit board according to claim 3, wherein the second dielectric layer comprises a laminate member provided with the second conductive pattern and a dielectric member that is interposed between the laminate member and the first dielectric layer and covers the circuit component.

5. A printed circuit board according to claim 3, wherein each of the plurality of via holes comprises a bottom surface.

6. A printed circuit board according to claim 3, wherein each of the plurality of protrusions has a shape different from that of the via hole in which it is inserted before the circuit component is mounted on the first dielectric layer, and is melted to take the shape of the via hole when the circuit component is mounted on the first dielectric layer.

7. A printed circuit board according to claim 3, wherein each of the plurality of protrusions has a shape different from that of the via hole in which it is inserted before the circuit component is mounted on the first dielectric layer, and is plastically deformed to take the shape of the via hole when the circuit component is mounted on the first diclectric layer.

* * * * *